(12) United States Patent
Ikeda et al.

(10) Patent No.: US 11,784,085 B2
(45) Date of Patent: Oct. 10, 2023

(54) PLASMA PROCESSING APPARATUS

(71) Applicant: TOKYO ELECTRON LIMITED, Tokyo (JP)

(72) Inventors: Taro Ikeda, Nirasaki (JP); Eiki Kamata, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 337 days.

(21) Appl. No.: 16/815,276

(22) Filed: Mar. 11, 2020

(65) Prior Publication Data

US 2020/0294842 A1 Sep. 17, 2020

(30) Foreign Application Priority Data

Mar. 13, 2019 (JP) ................................ 2019-046350

(51) Int. Cl.
*H01L 21/687* (2006.01)
*H01L 21/3065* (2006.01)
*H01L 21/67* (2006.01)

(52) U.S. Cl.
CPC .... *H01L 21/68714* (2013.01); *H01L 21/3065* (2013.01); *H01L 21/67103* (2013.01); *H01L 21/67248* (2013.01)

(58) Field of Classification Search
None
See application file for complete search history.

(56) References Cited

U.S. PATENT DOCUMENTS

| 6,156,151 A * | 12/2000 | Komino | H01J 37/3244 |
| | | | 118/723 R |
| 7,678,225 B2 * | 3/2010 | Nezu | H01J 37/32623 |
| | | | 118/723 VE |
| 2003/0198749 A1 * | 10/2003 | Kumar | H01J 37/32642 |
| | | | 118/723 R |
| 2007/0234960 A1 * | 10/2007 | Honda | H01J 37/32532 |
| | | | 156/345.47 |
| 2008/0236752 A1 * | 10/2008 | Honda | H01J 37/3244 |
| | | | 156/345.43 |
| 2009/0081878 A1 * | 3/2009 | Dhindsa | H01J 37/32091 |
| | | | 156/345.34 |
| 2010/0218785 A1 * | 9/2010 | Green | H01J 37/32642 |
| | | | 134/1.1 |
| 2011/0290419 A1 * | 12/2011 | Horiguchi | H01J 37/32834 |
| | | | 118/723 E |
| 2012/0160418 A1 * | 6/2012 | Hanaoka | H01J 37/32623 |
| | | | 156/345.38 |

(Continued)

FOREIGN PATENT DOCUMENTS

JP 2005-264177 A 9/2005
JP 2016-15496 A 1/2016

(Continued)

*Primary Examiner* — Sylvia MacArthur
(74) *Attorney, Agent, or Firm* — Nath, Goldberg & Meyer; Jerald L. Meyer; Tanya E. Harkins

(57) ABSTRACT

A plasma processing apparatus includes a stage provided in a chamber and having a heater therein, the stage being configured to place a substrate thereon, and an annular member provided around the stage to be spaced apart therefrom and formed of a dielectric material. At least one annular groove is formed in a lower surface of the annular member in a radial direction.

16 Claims, 7 Drawing Sheets

(56) References Cited

U.S. PATENT DOCUMENTS

| | | | | |
|---|---|---|---|---|
| 2014/0130743 | A1* | 5/2014 | Toriya | C23C 16/45574 |
| | | | | 118/725 |
| 2015/0255255 | A1* | 9/2015 | Ohata | H01L 21/68735 |
| | | | | 156/345.28 |
| 2018/0155823 | A1* | 6/2018 | Matsumoto | C23C 16/042 |
| 2020/0294842 | A1* | 9/2020 | Ikeda | H01J 37/32623 |

FOREIGN PATENT DOCUMENTS

| | | |
|---|---|---|
| KR | 1020010042483 A | 5/2001 |
| KR | 1020080080414 A | 9/2008 |
| KR | 1020190021076 A | 3/2019 |
| WO | 2009099186 A1 | 8/2009 |

* cited by examiner

PLASMA PROCESSING APPARATUS

CROSS-REFERENCE TO RELATED APPLICATION

This application is based upon and claims the benefit of priority from Japanese Patent Application No. 2019-046350, filed on Mar. 13, 2019, the entire contents of which are incorporated herein by reference.

TECHNICAL FIELD

The present disclosure relates to a plasma processing apparatus.

BACKGROUND

In an apparatus for applying high-frequency power, technology for suppressing abnormal discharge has been proposed (see, e.g., Patent Documents 1 to 3). Patent Document 1 discloses a sputter apparatus in which an upper shield is disposed between a backing plate for supporting a target and a shield for protecting a chamber inner wall from sputter particles, interposing a gap. The upper shield is provided with a through hole connecting the gap to the inside of the chamber, whereby it is possible to prevent gas generated from an O-ring from passing through a gap between the upper shield and the target, thereby preventing abnormal discharge via gas.

Patent Document 2 discloses, when a gas flow path for an introduction of a processing gas is provided in a dielectric window which transmits electromagnetic waves into a chamber in a form of a number of longitudinal grooves, a sufficiently high gas conductance is obtained while effectively preventing backflow or abnormal discharge of plasma in the gas flow path.

Patent Document 3 discloses adjusting a gap between an outer peripheral surface of a protrusion member and an inner peripheral surface of a side wall of an upper container to 2.5 mm≤d≤5 mm, setting a thickness of a vertical portion to 3 mm≤t≤8 mm, or adjusting a protrusion length of a cylindrical portion of the protrusion member to a length that is able to cover the vertical portion of the inner peripheral surface of the side wall, thereby controlling the electric field strength at the periphery of the dielectric plate.

PRIOR ART DOCUMENT

Patent Document

Patent Document Japanese Laid-Open Patent Publication No. 2005-264177

Patent Document Japanese Laid-Open Patent Publication No. 2016-015496

Patent Document International Publication No. WO 2009/099186

SUMMARY

According to embodiments of the present disclosure, there is provided a plasma processing apparatus that applies high-frequency power, the plasma processing apparatus including: a stage provided in a chamber and having a heater therein, the stage being configured to place a substrate thereon; and an annular member provided around the stage to be spaced apart therefrom and formed of a dielectric material, wherein at least one annular groove is formed in a lower surface of the annular member in a radial direction.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
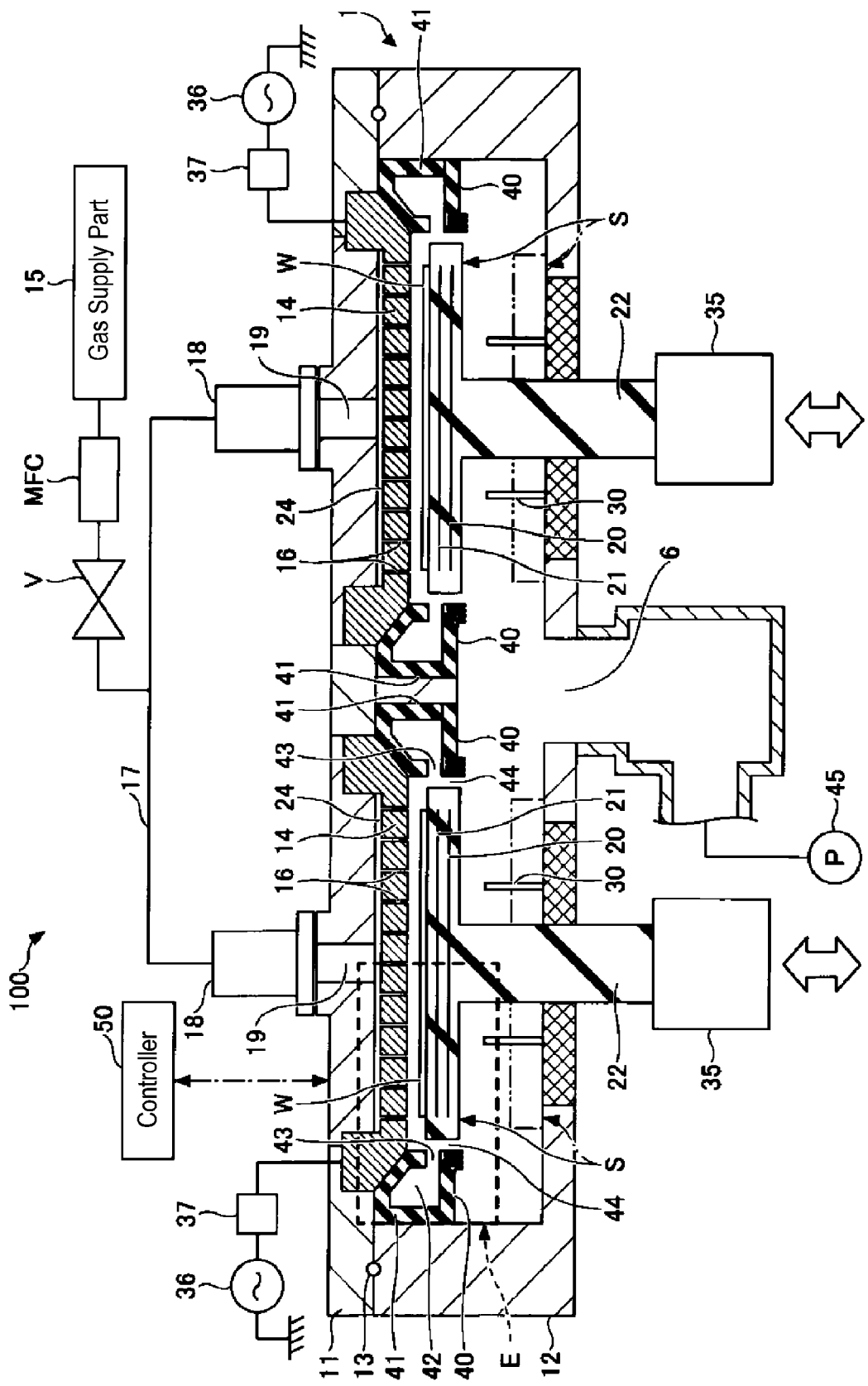
FIG. 1 is a schematic cross-sectional view illustrating an exemplary plasma processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the accompanying drawings. In each of the drawings, the same components are denoted by the same reference numerals, and redundant descriptions may be omitted.

[Plasma Processing Apparatus]

A plasma processing apparatus 100 according to an embodiment will be described with reference to FIG. 1. FIG. 1 is a schematic cross-sectional view illustrating an example of a plasma processing apparatus 100 according to an embodiment. The plasma processing apparatus 100 includes a chamber 1. The chamber 1 includes a container 12 and a lid 11. The container 12 and the lid 11 are made of, for example, aluminum, and the lid 11 is provided in an opening of the container 12 having a bottom. The chamber 1 and the lid 11 is sealed by an O-ring 13. As a result, the inside of the chamber 1 is configured to be sealable in a vacuum state. On the inner walls of the container 12 and the lid 11, a film having corrosion resistance to plasma may be formed. Ceramics such as aluminum oxide and yttrium oxide may be used for the film.

The container 12 has four stages S, and FIG. 1 illustrates two of the four stages. Each stage S is formed in a flat disk shape, and a wafer W is placed thereon. The stage S is formed of a dielectric material such as alumina ($Al_2O_3$). Inside the stage S, a heater 20 for heating the wafer W is embedded. The heater 20 is configured with, for example, a ceramic sheet-shaped or plate-shaped resistance heating element, which is supplied with electric power from a power supply part so as to generate heat, and heats the placement surface of the stage S so as to heat the wafer W to a predetermined process temperature suitable for film formation. For example, the heater 20 heats the wafer W placed on the stage S to a temperature between 100 degrees C. to 300 degrees C.

The stage S has a support 22 extending downward from the center of the lower surface, penetrating the bottom portion of the container 12. The support 22 is supported, at one end thereof, on a lifter 35. When the lifter 35 raises and lowers the support 22, the stage S is moved up and down between the processing position where processing of a wafer W is performed (the position illustrated in FIG. 1) and the delivery position where the delivery of the wafer W is performed. In addition, it is possible to adjust the distance (gap) between the stage S and an upper electrode 14 using the lifter 35.

The delivery position is a position of each stage S indicated by the two-dot chain line in FIG. 1. At this position, the delivery of the wafer W to/from an external transport mechanism is performed through a loading/unloading port. The stage S is formed with through holes through which the shafts of lifting pins 30 pass, respectively.

In the state in which the stage S has been moved from the processing position of the wafer W (see FIG. 1) to the delivery position of the wafer W, the heads of the lifting pins 30 protrude from the placement surface of the stage S. As a result, the heads of the lifting pins 30 support the wafer W from below the wafer W, lift the wafer W from the placement surface of the stage S, and deliver the wafer W to an external transport mechanism.

Four upper electrodes 14, which also function as shower heads, are provided above respective stages S and below the lid 11 so as to face respective stages S. Each upper electrode 14 is formed of a conductor such as aluminum and is substantially disk-shaped. Each upper electrode 14 is supported by the lid 11. In each stage S, a mesh-shaped metal electrode plate 21 is embedded in parallel with the heater 20. Thus, the stage S also functions as a lower electrode facing the upper electrode 14.

A large number of gas supply holes 16 are provided in each upper electrode 14. Under the control of a valve V and a flow controller MFC, a film forming gas (reactive gas) having a predetermined flow rate and output from the gas supply part 15 is introduced into gas inlets 18 through the gas line 17 at a predetermined timing. The introduced gas passes through the through holes 19 formed in the lid 11 and the flow paths 24 formed between the upper surfaces of the upper electrodes 14 and the lid 11, and is introduced into the container 12 from a large number of gas supply holes 16.

In addition, an RF power supply 36 is connected to each upper electrode 14 via a matcher 37, and high-frequency power having a frequency of, for example, 0.4 MHz to 2450 MHz is applied to the upper electrode 14 from the RF power supply 36. The gas introduced into the container 12 is turned into plasma by high-frequency power. With the plasma generated in the spaces between the upper electrodes 14 and the stages S, plasma processing such as film forming process is performed on the wafers W on the stages S.

Around each stage S, an annular member 40 made of a dielectric material such as quartz is provided to be spaced apart from the stage S (see the gaps 44 in FIG. 1). An exhaust manifold 41 is disposed on each annular member 40 and at the outer periphery of each upper electrode 14. The annular member 40 and the exhaust manifold 41 are formed integrally, and are fixed to the side wall of the container 12 and the outer periphery of the upper electrode 14.

The exhaust manifold 41 is formed of ceramics, and has an exhaust path 42 in the circumferential direction. The gas that passed through the exhaust path 42 passes through a plurality of exhaust ports 43 provided between the exhaust manifold 41 and the annular member 40, passes under the stage S, flows toward the exhaust port 6 in the bottom portion of the container 12, and is discharged from the exhaust port 6 to the outside of the chamber 1 by a vacuum pump 45. The exhaust port 43 may be a single exhaust port that is not divided into multiple ports and opens in the circumferential direction to the stage S.

In addition, although the example in which a single exhaust port 6 is provided in the bottom portion of the chamber 1 has been described, the present disclosure is not limited thereto. For example, one or more exhaust ports 6 may be provided in the ceiling portion of the chamber 1, or one or more exhaust ports 6 may be provided in the bottom portion and the ceiling portion of the chamber 1.

The plasma processing apparatus 100 may further include a controller 50. The controller 50 may be a computer including, for example, a processor, a storage part such as memory, an input device, a display device, and a signal input/output interface. The controller 50 controls each part of the plasma processing apparatus 100. In the controller 50, an operator may perform, for example, a command input operation in order to manage the plasma processing apparatus 100, using the input device. In addition, in the controller 50, the operation situation of the plasma processing apparatus 100 may be visualized and displayed by the display device. The storage part stores a control program and recipe data. The control program is executed by the processor in order to execute various kinds of processing in the plasma processing apparatus 100. The processor executes the control program so as to control each part of the plasma processing apparatus 100 according to the recipe data.

[Abnormal Discharge and Countermeasure]

Figure 2A:
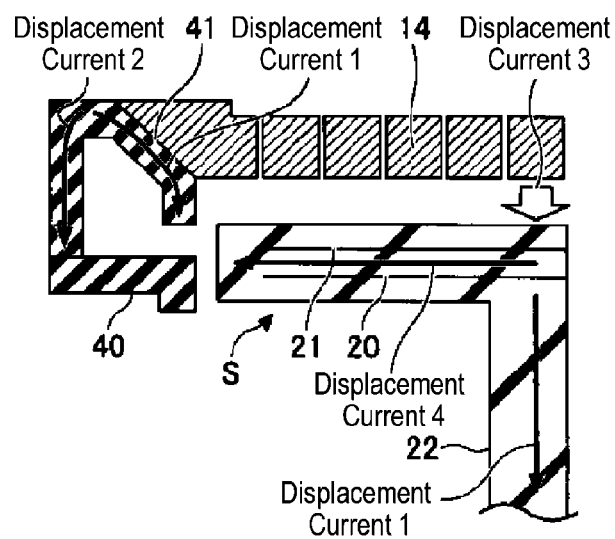
FIGS. 2A to 2F are views illustrating examples of surroundings of stages according to a comparative example, an embodiment and its modification.
Figure 2B:
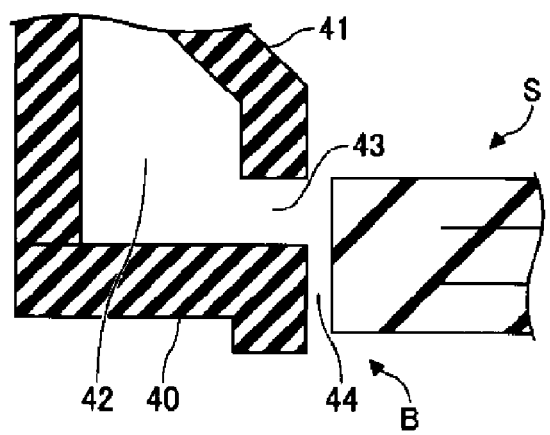
Figure 2C:
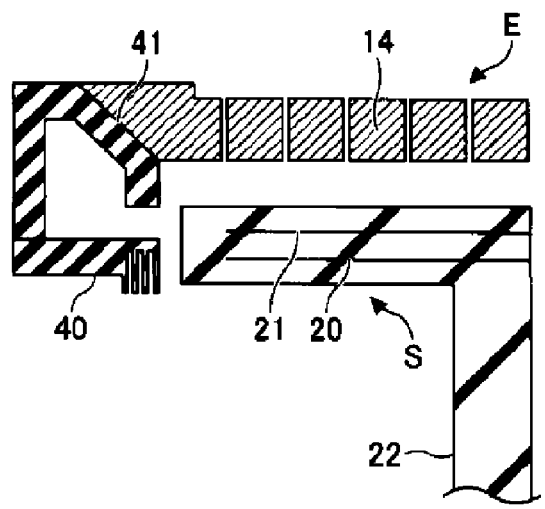
Figure 2D:
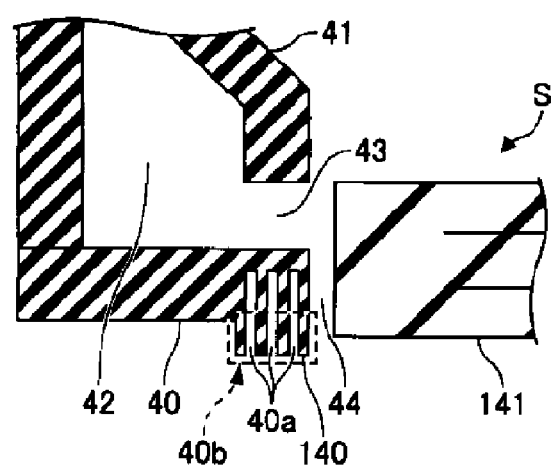
Figure 2E:
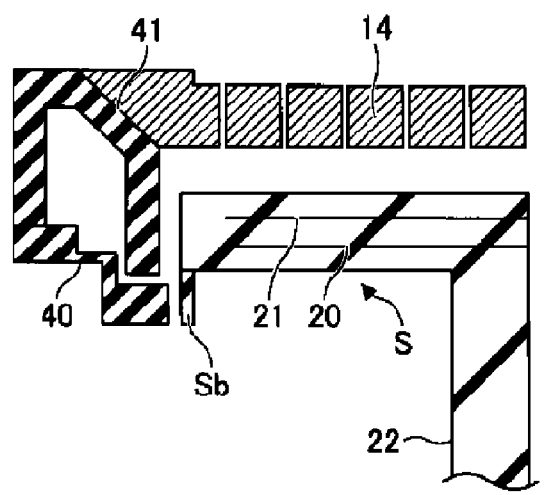
Figure 2F:
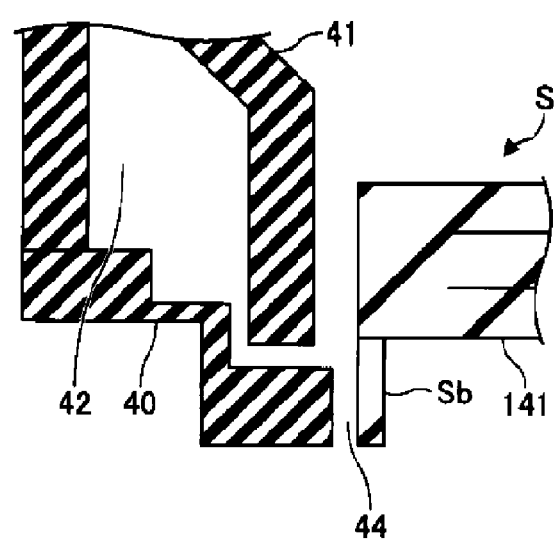

Next, with reference to FIGS. 2A to 2F, abnormal discharge, which is likely to occur around a stage S, and a countermeasure therefor will be described. FIGS. 2A to 2F are views illustrating examples of surroundings of stages S according to an embodiment and a modification and a comparative example. FIGS. 2A and 2B illustrate an exemplary configuration of the stage S and its surroundings according to a comparative example. FIGS. 2C and 2D illustrate an exemplary configuration of the stage S and its surroundings according to the present embodiment. FIGS. 2E and 2F illustrate an exemplary configuration of the stage S and its surroundings according to a modification of the present embodiment.

The high-frequency power output from the RF power supply 36 illustrated in FIG. 1 is applied to the upper electrode 14. As a result, as illustrated in FIGS. 2A and 2B, a displacement current (hereinafter, referred to as "displacement current 3") flows between the upper electrode 14 and the stage S, which functions as a lower electrode. The displacement current is represented by the flow of an electric field, that is, the time derivative of an electric field.

In addition, the high frequency waves output from the RF power supply 36 flow on the surfaces of the metal lid 11 and the container 12 outside the upper electrode 14 and propagate through the exhaust manifold 41. As a result, an electric field is generated in the exhaust manifold 41 formed of ceramics.

According to Ampere-Maxwell's law, a displacement current, which is the time derivative of the electric field, flows in an alternating electric field even in a dielectric material such as ceramics. Accordingly, the displacement currents in the two directions illustrated in FIGS. 2A and 2B (hereinafter, the displacement current at the inner side (upper electrode 14 side) illustrated in FIGS. 2A and 2B is referred to as "displacement current 1" and the displacement current at the outer side is referred to as "displacement current 2") flow in the exhaust manifold 41.

In addition, as illustrated in FIGS. 2A and 2B, a displacement current (hereinafter, referred to as "displacement current 4") flows from the center of the stage S toward the outside of the stage S, and a displacement current (hereinafter, referred to as "displacement current 1") flows downward from the center of the stage S.

Figure 3:
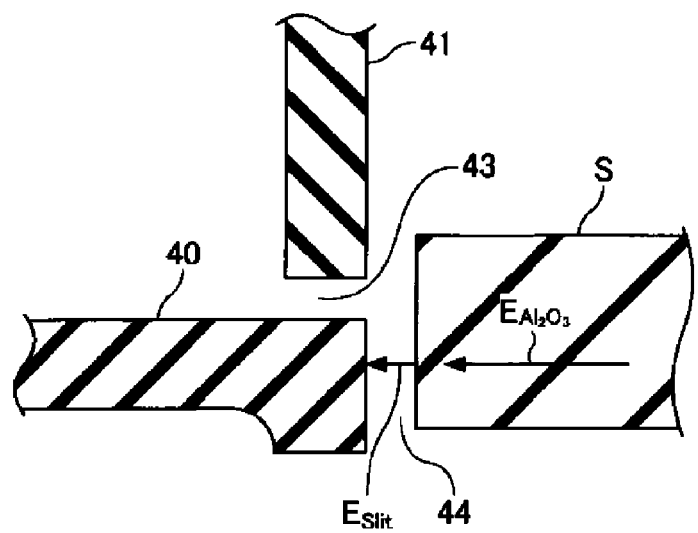
FIG. 3 is a view illustrating an exemplary electric field around a stage according to a comparative example.

The displacement current 3 flows between the upper electrode 14 and the electrode plate 21 of the stage S, and contributes to the generation of plasma. Therefore, the displacement current 3 is preferably large. In contrast, when the displacement current 4 is large, a strong electric field is generated in the gap 44 between the stage S and the annular member 40 as illustrated in FIG. 3. The electric field generated in the gap 44 is indicated by $E_{slit}$. In particular, the surroundings of the stage S are configured to disturb the displacement current because the dielectric constants are changed in such a manner of the stage S of a dielectric→the gap 44 of the vacuum space→the annular member 40 of a dielectric. Thus, the electric field $E_{slit}$ becomes stronger in the structural portion of the gap 44.

For example, assuming that the dielectric constant of alumina is $\varepsilon_{Al2O3}$, the dielectric constant of vacuum is $\varepsilon_0$, and the electric field generated in the stage made of alumina is $E_{Al2O3}$, the electric field $E_{slit}$ generated in the gap 44 is expressed by Equation (1) as follows.

$$E_{slit} = (\varepsilon_{Al2O3}/\varepsilon_0) \times E_{Al2O3} \quad (1)$$

According to Equation (1), the electric field $E_{slit}$ generated in the gap 44 becomes larger as the dielectric constant of the dielectric of the stage S becomes greater than the dielectric constant $\varepsilon_0$ of vacuum, and abnormal discharge is likely to occur around the stage S. For example, since the dielectric constant $\varepsilon_{Al2O3}$ of the dielectric of the stage S with respect to the dielectric constant $\varepsilon_0$ of vacuum is about 10, when the stage S is formed of alumina, the electric field $E_{slit}$ generated in the gap 44 around the stage S is about 10 times as large as the electric field $E_{Al2O3}$ generated in the stage S.

In particular, two metals of the heater 20 and the electrode plate 21 are embedded in the stage S in the horizontal direction. In this case, a strong displacement current 4 is likely to occur in the stage S. Therefore, in the present embodiment, a configuration is adopted in which the impedance in the transmission path of the displacement current around the stage S, i.e., the stage S→the gap 44→the annular member 40, is increased.

This makes it possible to suppress occurrence of abnormal discharge around the stage S. In addition, this makes it possible to reduce the displacement current in the vacuum portion other than the displacement current 3 flowing between the upper electrode 14 and the stage S as much as possible, and thus increase the displacement current 3 and enhance the plasma generation efficiency.

FIGS. 2C and 2D illustrate an exemplary configuration around the stage S according to the present embodiment. FIG. 2C is an enlarged view of the inside of the dotted frame E in FIG. 1. As illustrated in a further enlarged view in FIG. 2D, in the lower surface 140 of the annular member 40 according to the present embodiment, a plurality of annular grooves 40a are provided in the vicinity of the gap 44 in the radial direction. Each of the grooves 40a are formed in a slit shape. In FIGS. 2C and 2D, three annular grooves 40a are formed in the radial direction. However, the number of annular grooves 40a is not limited thereto. The number of annular grooves 40a may be one or two or may be four or more. The grooves 40a have the same width and the same depth, and are formed concentrically.

In the comparative example of FIGS. 2A and 2B, the annular member 40 has no groove. In this case, the displacement current $I_{d1}$ flowing through the gap 44, which is a vacuum space, is represented by the following equation, and is substantially equal to the displacement current I flowing through the stage S as illustrated in the circuit on the left side of FIG. 4.

$$I = I_{d1} = \varepsilon_0 \frac{\partial E_{slit}}{\partial t} \qquad \text{[Equation 1]}$$

Figure 4:
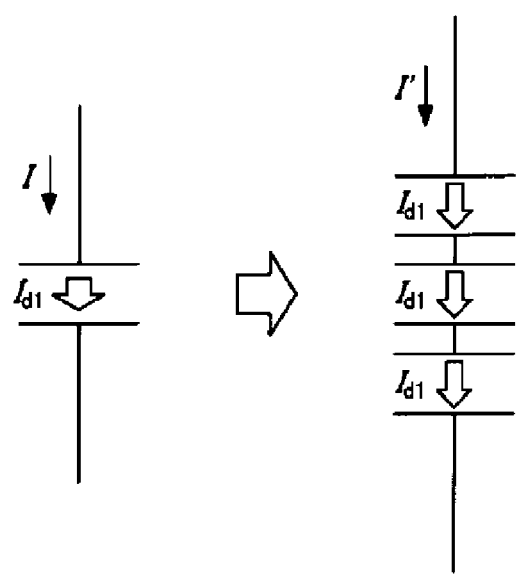
FIG. 4 is a circuit configuration diagram for describing a displacement current around a stage according to an embodiment.

Meanwhile, in the present embodiment of FIGS. 2C and 2D, by forming three annular grooves 40a opened in the lower surface 140 of the annular member 40, the flow of the displacement current I' flowing in the stage S (the displacement current 4 illustrated in FIG. 2A) can be disturbed, as illustrated in FIG. 4. That is, as illustrated in the series circuit on the right side of FIG. 4, it is possible to obtain a configuration in which the electric field in the annular member 40 is distributed by the grooves 40a, and thus the impedance of the transmission path of the displacement, i.e., the stage S→the gap 44→the annular member 40, increases. That is, the impedance increases in the vicinity of the grooves 40a, and the displacement current $I_{d1}$ flowing through the gap 44 decreases. Accordingly, the displacement current $I_{d1}$ flowing through the gap 44 in this case is substantially equal to the displacement current I' (displacement current 4) flowing through the stage S, and is much smaller than the displacement current I flowing through the gap 44 in the configuration of the comparative example illustrated in FIGS. 2A and 2B. From the foregoing, with the annular member 40 according to the present embodiment, it is possible to reduce the displacement current $I_{d1}$ flowing through the gap 44.

In addition, as illustrated in FIG. 2D, the annular member 40 extends downward at a portion where the grooves 40a are formed, and forms a step 40b on the lower surface of the annular member. Thus, the lower surface 140 of the annular member 40 is lower than the lower surface 141 of the stage S in the portion of the step 40b. With such a configuration and the grooves 40a, the electric field generated by the high-frequency waves passing through the annular member 40 is distributed, and the impedance is increased at the end of the annular member 40. This makes it possible to obtain a structure in which the displacement current I' (displacement current 4) is difficult to flow from the stage S to the annular member 40.

As described above, the annular member 40 according to the present embodiment functions as an insulating member that reflects high-frequency waves. This makes it possible to weaken the electric field strength in the gap 44 between the stage S and the annular member 40, and thus suppress the occurrence of abnormal discharge around the stage S.

[Modification]

Next, a modification illustrated in FIGS. 2E and 2F will be described. For example, as illustrated in FIGS. 2E and 2F, the stage S may have a ceramic connection member Sb extending downward from an end portion, and the annular member 40 may be provided around the connection member Sb with a distance from the connection member Sb. The annular member 40 may have a step, as illustrated in FIGS. 2E and 2F.

As the thicknesses of the stage S and the annular member 40 around the gap 44 increase, the impedance decreases, and the displacement current easily passes therethrough. Thus, the electric field in the gap 44 becomes stronger. Accordingly, in this modification, a thin ceramic connection member Sb is provided below the end of the stage S. This may allow the connection member Sb to function as a capacitor so as to increase the impedance and to make it difficult to pass the displacement current. In addition, by making the annular member 40 thinner and providing a step, the impedance is further increased, whereby it is possible to enhance the function of the annular member 40 as an insulating member that reflects high-frequency waves. This makes it possible to weaken the electric field strength in the gap 44 between the stage S and the annular member 40, and thus suppress the occurrence of abnormal discharge around the stage S.

In addition, the configuration according to the present embodiment and the configuration according to the modification may be combined and applied. Furthermore, the annular members 40 according to FIGS. 5A and 5B and the configuration according to the modification may be combined and applied.

Figure 5A:
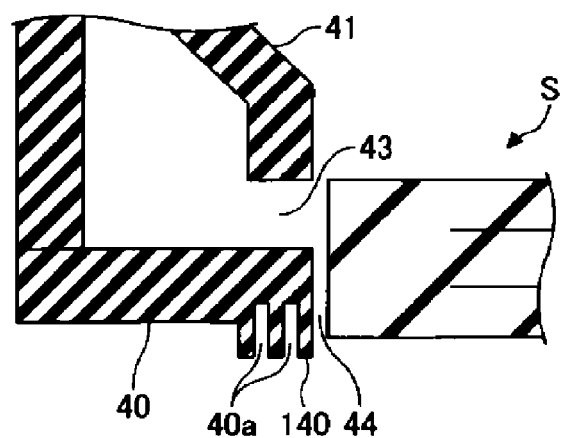
FIGS. 5A to 5C are views illustrating annular members according to an embodiment in comparison with a comparative example.
Figure 5B:
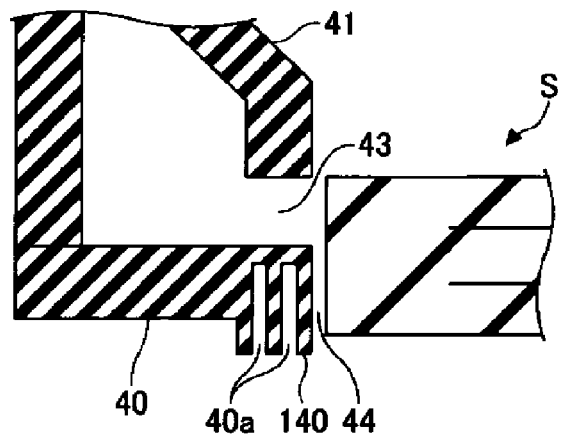

The annular members 40 illustrated in FIGS. 5A and 5B have two annular grooves 40a. The grooves 40a illustrated in FIG. 5B are deeper than the grooves 40a illustrated in FIG. 5A. However, all the adjacent grooves 40a have the same width and the same depth.

It is preferable that the width of the two annular grooves 40a illustrated in FIGS. 5A and 5B is substantially equal to or approximately equal to the interval (gap 44) between the stage S and the annular member 40. In addition, it is preferable that the interval between the grooves 40a is substantially equal to or approximately equal to the gap 44.

Figure 5C:
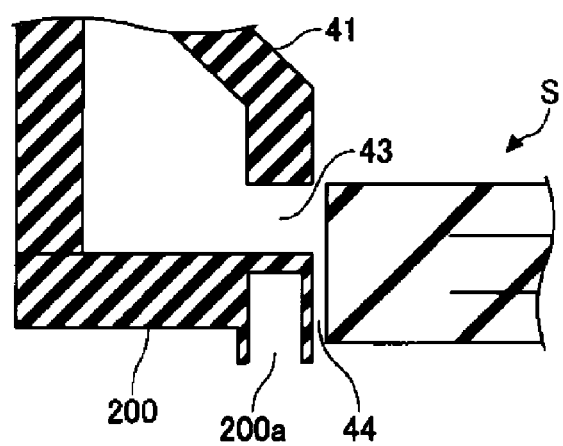

As illustrated in FIG. 5C, when the width of a groove 200a provided in an annular member 200 is significantly larger than the gap 44, the electric field is concentrated to the groove 200a, and abnormal discharge is likely to occur around the groove 200a and the gap 44. Accordingly, a single groove 40a may be provided in the annular member 40, but the width thereof is preferably substantially equal to or approximately equal to the interval (gap 44) between the stage S and the annular member 40.

As described above, with the plasma processing apparatuses 100 according to the present embodiment and the modification, by forming the grooves 40a in the lower surface of the annular member 40 provided around the stage S with a distance from the stage S, the electric field generated by the high frequency waves passing through the annular member 40 is distributed. This makes it possible to lower the electric field strength of the gap 44 between the stage S and the annular member 40, and thus reduce the displacement current flowing through the stage S. Thus, it is possible to prevent abnormal discharge.

The plasma processing apparatus of the present disclosure is applicable to any of an atomic layer deposition (ALD) type apparatus, a capacitively coupled plasma (CCP) type apparatus, an inductively coupled plasma (ICP) type apparatus, a radial line slot antenna type apparatus, an electron cyclotron resonance plasma (ECR) type apparatus, and a helicon wave plasma (HWP) type apparatus.

The plasma processing apparatus according to the present disclosure is not limited to the apparatus that is capable of simultaneously processing four wafers W placed on the four stages illustrated in FIG. 1. For example, the plasma processing apparatus according to the present disclosure may be an apparatus that is capable of simultaneously processing two or more wafers W placed on two or more stages S arranged to face the upper electrodes 14, respectively. In addition, the plasma processing apparatus according to the present disclosure may be an apparatus that is capable of sequentially processing one wafer W placed on one stage S arranged to face the upper electrode 14, respectively.

According to an aspect, it is possible to prevent abnormal discharge.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus that applies high-frequency power, the plasma processing apparatus comprising:
    a stage provided in a chamber and having a heater therein, the stage being configured to place a substrate thereon; and
    an annular member provided around the stage to be spaced apart therefrom and formed of a dielectric material,
    wherein at least one annular groove is formed in a lower surface of the annular member in a radial direction,
    wherein the at least one annular groove is partially defined by two walls facing each other with a space between the two walls in the radial direction, and the space remains empty when the high-frequency power is applied,
    wherein the two walls extend in a circumferential direction of the stage, and
    wherein the annular member extends downward at a portion where the at least one annular groove is formed so as to form a step in which the at least one annular groove protrudes from the lower surface of the annular member.

2. The plasma processing apparatus of claim 1, wherein the step is provided between the lower surface of the annular member and a lower surface of the stage.

3. The plasma processing apparatus of claim 2, wherein the at least one annular grooves is a plurality of annular grooves, and
    each of the annular grooves has a same width and a same depth.

4. The plasma processing apparatus of claim 3, wherein an interval of the plurality of annular grooves is equal to an interval between the stage and the annular member.

5. The plasma processing apparatus of claim 4, wherein the width of each of the plurality of annular grooves is equal to an interval between the stage and the annular member.

6. The plasma processing apparatus of claim 5, wherein an exhaust manifold is provided on the annular member.

7. The plasma processing apparatus of claim 6, wherein the exhaust manifold is formed integrally with the annular member, and has a plurality of exhaust ports in a circumferential direction.

8. The plasma processing apparatus of claim 7, further comprising:

a connection member extending downward from an end of a lower surface of the stage, and wherein the annular member is provided around the connection member with a distance from the connection member.

9. The plasma processing apparatus of claim 8, further comprising:

a high frequency power supply configured to apply high-frequency power of a frequency of 0.4 MHz to 2450 MHz.

10. The plasma processing apparatus of claim 9, further comprising:

an upper electrode facing the stage, wherein the high-frequency power is applied to the upper electrode or the stage.

11. The plasma processing apparatus of claim 3, wherein the width of each of the plurality of annular grooves is equal to an interval between the stage and the annular member.

12. The plasma processing apparatus of claim 1, wherein the at least one annular grooves is a plurality of annular grooves, and each of the annular grooves has a same width and a same depth.

13. The plasma processing apparatus of claim 1, wherein an exhaust manifold is provided on the annular member.

14. The plasma processing apparatus of claim 1, further comprising:

a connection member extending downward from an end of a lower surface of the stage, and wherein the annular member is provided around the connection member with a distance from the connection member.

15. The plasma processing apparatus of claim 1, further comprising:

a high frequency power supply configured to apply high-frequency power of a frequency of 0.4 MHz to 2450 MHz.

16. The plasma processing apparatus of claim 1, further comprising:

an upper electrode facing the stage, wherein the high-frequency power is applied to the upper electrode or the stage.

* * * * *